US007952774B2

(12) United States Patent
Ikeda

(10) Patent No.: US 7,952,774 B2
(45) Date of Patent: May 31, 2011

(54) IMAGE FORMING APPARATUS, IMAGE FORMATION CONTROL METHOD, AND COMPUTER PROGRAM PRODUCT

(75) Inventor: Hiroaki Ikeda, Osaka (JP)

(73) Assignee: Ricoh Company, Limited, Tokyo (JP)

( * ) Notice: Subject to any disclaimer, the term of this patent is extended or adjusted under 35 U.S.C. 154(b) by 961 days.

(21) Appl. No.: 11/889,004

(22) Filed: Aug. 8, 2007

(65) Prior Publication Data

US 2008/0043299 A1 Feb. 21, 2008

(30) Foreign Application Priority Data

Aug. 21, 2006 (JP) ................................. 2006-223976

(51) Int. Cl.
*G03F 3/08* (2006.01)

(52) U.S. Cl. ........ 358/518; 358/474; 358/1.9; 358/1.18; 358/500; 399/301; 399/303; 399/371

(58) Field of Classification Search .................. 358/474, 358/518, 1.9, 1.14, 1.18; 399/301, 49, 371, 399/82, 81, 299, 300; 347/116
See application file for complete search history.

(56) References Cited

U.S. PATENT DOCUMENTS

| | | | | |
|---|---|---|---|---|
| 4,972,234 | A * | 11/1990 | Tanaka et al. | 399/300 |
| 5,548,379 | A * | 8/1996 | Fukuchi et al. | 399/116 |
| 6,295,435 | B1 | 9/2001 | Shinohara et al. | |
| 6,380,960 | B1 | 4/2002 | Shinohara | |
| 6,421,521 | B2 * | 7/2002 | Tanaka | 399/299 |
| 6,603,574 | B1 * | 8/2003 | Ramirez et al. | 358/1.9 |
| 6,693,654 | B2 | 2/2004 | Shinohara | |
| 6,885,473 | B2 * | 4/2005 | Tsuruya | 358/1.18 |
| 7,110,687 | B2 * | 9/2006 | Furukawa | 399/49 |
| 7,110,691 | B2 * | 9/2006 | Saida | 399/69 |
| 7,580,661 | B2 * | 8/2009 | Aikawa | 399/301 |
| 7,664,407 | B2 * | 2/2010 | Yamanaka et al. | 399/9 |
| 7,734,234 | B2 * | 6/2010 | Ikeda | 399/301 |
| 2001/0004425 | A1 * | 6/2001 | Shinohara et al. | 399/301 |
| 2003/0052958 | A1 | 3/2003 | Shinohara | |
| 2004/0033090 | A1 * | 2/2004 | Yamanaka et al. | 399/301 |
| 2004/0239747 | A1 * | 12/2004 | Maeda | 347/116 |
| 2004/0253013 | A1 * | 12/2004 | Furukawa | 399/49 |
| 2005/0009351 | A1 | 1/2005 | Takahashi et al. | |
| 2005/0013636 | A1 * | 1/2005 | Sawai et al. | 399/302 |
| 2005/0031361 | A1 | 2/2005 | Kobayashi | |
| 2006/0002727 | A1 | 1/2006 | Kanzaki | |
| 2006/0093409 | A1 * | 5/2006 | Kyung | 399/299 |

(Continued)

FOREIGN PATENT DOCUMENTS

EP 1 575 258 9/2005

(Continued)

OTHER PUBLICATIONS

European Search Report, Feb. 8, 2008.

*Primary Examiner* — Negussie Worku
(74) *Attorney, Agent, or Firm* — Harness, Dickey & Pierce, P.L.C.

(57) ABSTRACT

Correction patterns are formed on a conveyor belt that conveys a transfer paper. The correction patterns are include positional-deviation correction patterns arranged at both sides of the conveyer belt and density correction patterns (patches) formed in the central region of the conveyer belt in the main scanning direction.

15 Claims, 7 Drawing Sheets

U.S. PATENT DOCUMENTS

| | | | | |
|---|---|---|---|---|
| 2007/0177912 | A1 | 8/2007 | Ikeda | |
| 2007/0292169 | A1 * | 12/2007 | Bitoh et al. | 399/298 |

FOREIGN PATENT DOCUMENTS

| | | |
|---|---|---|
| JP | 11-249380 | 9/1999 |
| JP | 2002-244393 | 8/2002 |
| JP | 2003-186278 | 7/2003 |
| JP | 2004-101567 | 4/2004 |
| JP | 2004-109475 | 4/2004 |
| JP | 2004-272288 | 9/2004 |
| JP | 2004-287403 | 10/2004 |

* cited by examiner

IMAGE FORMING APPARATUS, IMAGE FORMATION CONTROL METHOD, AND COMPUTER PROGRAM PRODUCT

CROSS-REFERENCE TO RELATED APPLICATIONS

The present application claims priority to and incorporates by reference the entire contents of Japanese priority document, 2006-223976 filed in Japan on Aug. 21, 2006.

BACKGROUND OF THE INVENTION

1. Field of the Invention

The present invention relates to a so-called tandem type image forming apparatus. More particularly, the present invention relates to formation and detection of test patterns used for adjusting image forming conditions.

2. Description of the Related Art

In image forming apparatuses, such as printers, digital copiers, and facsimile, that form an image by an electrophotographic method, a method of writing images on a photosensitive body using a laser beam scanning has become mainstream in recent years. The method includes periodically scanning (main scanning) a laser, in which lighting is controlled by video (line image) signals, with a beam scanning optical system. The optical system includes a polygon mirror and the like. The laser is projected onto the photosensitive body on a surface to be scanned, and the photosensitive body is generally moved in a direction perpendicular to the main scan (sub-scan) direction. By using such a scanning exposure, the two dimensional image is drawn on the photosensitive body.

An electrostatic latent image formed on the photosensitive body by the scanning exposure is then developed by a toner, transferred directly on a recording (transfer) paper or transferred via an intermediate transfer medium, and fixed. By executing each step, an image forming process is completed.

When a color image is formed by carrying out a step of scanning exposure using a light beam as the above, the scanning exposure of the photosensitive body is performed by each color component of the color image. Accordingly, the color image is formed through a process of synthesizing each color component. In the related art, a method that a single photosensitive body is commonly used to each color component, and performs the color synthesizing at the step of scanning exposure (write) or a step of transferring is known. Another known method is a so-called tandem type that provides photosensitive bodies for each color component, writes respective color component images to each photosensitive body, and performs the color synthesizing at the step of transferring thereafter.

In the tandem type image forming apparatuses, the color synthesizing is performed by performing scanning exposure on the respective photosensitive bodies of each color component. As a result, positional deviations and density deviations tend to occur between the respective color component images being synthesized. A step of image forming needs to be managed so that these deviations do not occur. Therefore, by detecting the states of the image forming system of each color component, and adjusting the image forming conditions and the image forming system corresponding to a change in the states, a proper image output should be obtained.

A conventionally known method that detects states of the image forming system adopted in the tandem type, forms test patterns by actually operating the image forming system of each color component under a predetermined condition. The formed test patterns of each color component are read, thereby detecting deviation amounts from the read result. After detecting this state, control amounts are corrected based on the detected deviation amounts, thereby controlling the image forming system to operate properly. “Correction patterns” hereinafter described indicate the test patterns.

In the method of forming the correction patterns and detecting the states of the image forming system in the related art, when the image forming system is operated properly, one example is a method of forming the correction patterns of each color on a conveyor belt of a transfer paper or an intermediate transfer belt. The correction patterns are formed in the main and the sub-scanning directions in a predetermined position relationship. Then, errors are calculated from the deviation amounts from the predetermined position appearing on the correction patterns. For example, Japanese Patent Application Laid-Open No. H11-249380 and Japanese Patent Application Laid-Open No. 2004-287403 are exemplified as the ones adopting a method of forming correction toner marks. The correction toner marks are formed at two detection positions on the conveyor belt in the main scanning direction and may detect the deviation amounts in the respective main scanning and the sub-scanning directions. In these patent documents, a method of respectively detecting an inclination (skew), a resist in the sub-scanning direction, a resist in the main scanning direction, and a magnification error in the main scanning direction that cause the positional deviations between each color component image is shown. The control amounts such as an image write start timing is adjusted according to the detection result, thereby operating the image forming system properly.

In Japanese Patent No. 3644923 and Japanese Patent Application Laid-Open No. 2004-101567, an example of a method that is basically the same as the Japanese Patent Application Laid-Open No. H11-249380 and the Japanese Patent Application Laid-Open No. 2004-287403, but intended to further improve the detection accuracy is shown. In the method, correction toner marks are formed at three detection positions on the conveyor belt in the main scanning direction. The correction toner marks may detect the deviation amounts in the respective main scanning direction and the sub-scanning direction.

Further, in the Japanese Patent No. 3644923, not only detecting the toner marks for positional-deviation correction, but also a configuration of forming density correction toner marks (patches) of each color, and commonly using a detecting unit for the positional-deviation correction to detect the density correction toner marks is adopted. Here, in a scanning exposing unit, a writing timing of an image, a drive of the photosensitive body, an exposure, and the like, are adjusted according to detected amounts of the positional deviation. In a toner developing unit, a developing bias and a charging bias are adjusted according to the detected amounts of the density deviation.

However, in the conventional methods that detect the states of the image forming system by detecting each patterns of the positional-deviation correction and the density correction, as shown in the Japanese Patent No. 3644923, formation of each of the correction patterns and detection process of the patterns are performed separately.

In other words, while correction operation is performed, the conveyor belt, the intermediate transfer belt, or the like forming the correction patterns are only used for the correction. Therefore, the processing time for the positional-deviation correction and the density correction need to be added up for the required processing time. The longer processing time of the conventional method hampers the processing speed.

SUMMARY OF THE INVENTION

It is an object of the present invention to at least partially solve the problems in the conventional technology.

According to an aspect of the present invention, there is provided an image forming apparatus including a first image carrying member corresponding to each of a plurality of colors, the first image carrying member having a photosensitive surface configured to carry a latent image; a scanning unit corresponding to each of the colors, the scanning unit configured to scan with light a photosensitive surface of a corresponding one of the first image carrying members in a main scanning direction and a sub-scanning direction thereby forming a color-component correction latent image used for correcting image forming conditions, wherein the scanning unit forms in the main scanning direction at least one pattern of the color-component correction latent image corresponding to each of the image forming conditions; a developing unit corresponding to each of the colors, the developing unit configured to develop a color-component correction latent image on a photosensitive surface of a corresponding one of the first image carrying members thereby obtaining a color-component correction visual image in a corresponding color; a second image carrying member configured to carry the color-component correction visual images; a transferring unit that transfers each of the color-component correction visual images from the first image carrying member to the second image carrying member while the second image carrying member is conveyed in the sub-scanning direction thereby forming the pattern by aligning the color-component correction visual images in the sub-scanning direction; a pattern detecting unit configured to detect the color-component correction pattern visual images in the pattern on the second image carrying unit; and a correcting unit that corrects the image forming conditions for each of the colors based on a detection result obtaining by the pattern detecting unit.

According to another aspect of the present invention, there is provided an image formation control method including scanning with light a plurality of a first image carrying members in a main scanning direction and a sub-scanning direction thereby forming a color-component correction latent image on each of the first image carrying members used for correcting image forming conditions, wherein the scanning includes forming in the main scanning direction at least one pattern of the color-component correction latent image corresponding to each of the image forming conditions; developing the color-component correction latent image on each of the first image carrying members thereby obtaining a color-component correction visual image on each of the first image carrying members; transferring each of the color-component correction visual images from each of the first image carrying members to a second image carrying member while the second image carrying member is conveyed in the sub-scanning direction thereby forming the pattern by aligning the color-component correction visual images in the sub-scanning direction; detecting the color-component correction pattern visual images in the pattern on the second image carrying unit; and correcting the image forming conditions for each of the colors based on a detection result obtaining at the detecting.

According to still another aspect of the present invention, there is provided a computer program product that implements the above image formation control method on a computer.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of the present invention will now be described below while referring to accompanying drawings. In the following embodiments, the present invention has been applied to an electrophotographic color image forming apparatus. The electrophotographic color image forming apparatus optically writes a two-dimensional image on a photosensitive body by main scanning and sub-scanning methods using a laser diode (LD).

The present embodiment shows a typical device of this type that photosensitive drums of each color are arranged at a constant pitch in a conveying direction of a conveyor belt of transfer paper. The device synthesizes a color image on the transfer paper conveyed by the belt, when an image is transferred from the photosensitive body of each color. Not only a method of transferring the image directly from the photosensitive body, but also a method of transferring the image via an intermediate transfer medium may be used as the present embodiment.

Figure 1:
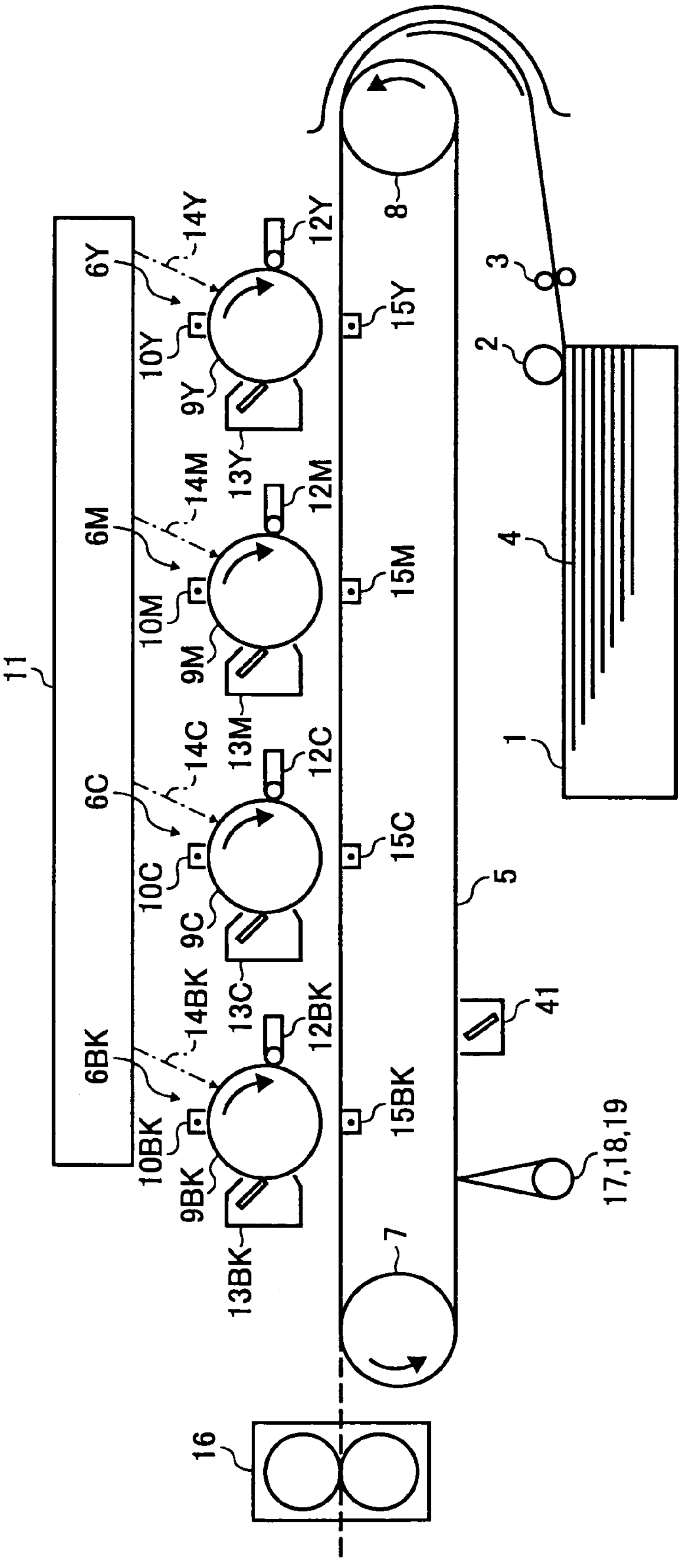
FIG. 1 is a schematic diagram of a tandem type color image forming apparatus according to an embodiment of the present invention.

FIG. 1 is a schematic diagram of a tandem type color image forming apparatus of the present embodiment. In this image forming apparatus, image forming units 6Y, 6M, 6C, and 6BK are arranged in a line sequentially along a moving direction of a conveyor belt 5 from upstream. The conveyor belt 5 conveys a transfer paper sheet 1 as an image recording medium. The image forming units 6Y, 6M, 6C, and 6BK form an image of each color component (yellow: Y, magenta: M, cyan: C, and black: BK) forming a color image.

The conveyor belt 5 is an endless belt. The conveyor belt 5 is rolled on a driving roller 7 that drives and rotates, and a driven roller 8 that is driven and rotated. The conveyor belt 5 is rotated and driven by the driving roller 7 in an arrow direction in FIG. 1. Transfer paper sheets 4 are stacked in a paper feed tray 1 provided under the conveyor belt 5. The transfer paper positioned at the top of the transfer paper sheets 4 stacked in the paper feed tray 1 is fed at a time of an image formation and sticks on the conveyor belt 5 because of an electrostatic adsorption. The stuck transfer paper 4 is conveyed to a first image forming unit (yellow) 6Y, and a yellow image being formed here is transferred thereto.

The first image forming unit (yellow) 6Y includes a photosensitive drum 9Y. A charger 10Y, an exposing unit 11, a developing unit 12Y, and a cleaning unit 13Y are arranged around the photosensitive drum 9Y. The image forming units of each color 6Y, 6M, 6C, and 6BK have the same configuration except that toner images to form are different. Therefore, a description other than the first image forming unit (yellow) is omitted.

Writing an image on the photosensitive drum 9Y using a laser beam is conducted as follows: A photosensitive surface of the photosensitive drum 9Y is uniformly charged by the charger 10Y. Then, the photosensitive surface of the photosensitive drum 9Y is exposed to laser light 14Y driven by yellow image signals by the exposing unit 11. Accordingly, an electrostatic latent image is formed on the photosensitive surface. The exposing unit 11 controls a drive of an LD light source (not shown) by line synchronization signals in a main scanning direction. The generated light is projected to the photosensitive surface at a predetermined cycle as a scanning beam. At the same time, the exposing unit 11 drives and moves (rotating) the photosensitive drum 9Y by a motor control in a sub-scanning direction intersecting with the main scanning direction. Thus, the two dimensional image is scanned and exposed by the scanning beam.

The electrostatic latent image formed on the photosensitive surface is developed with a yellow toner by the developing unit 12Y, and a toner image is formed on the photosensitive drum 9Y. The toner image is transferred to a position that the photosensitive drum 9Y and the transfer paper on the conveyor belt 5 come in contact with each other (transfer position) by a transferring unit 15Y. Thus, a yellow single-color image is formed on the transfer paper 4.

After removing unnecessary residual toner left on the drum surface with the cleaning unit (not shown), the photosensitive drum 9Y that has finished the transferring of the toner image waits for the formation of the next image. Accordingly, the transfer paper 4 to which the yellow image is transferred at the first image forming unit 6Y is conveyed to a second image forming unit (magenta) 6M by the conveyor belt 5. Here, the toner image is also formed on the photosensitive drum 9M, as the first image forming unit (yellow) 6Y. In the second image forming unit 6M, the formed toner image (magenta) is superposes onto the transfer paper 4 to which the yellow image is already transferred. The transfer paper 4 is further conveyed to a third image forming unit (cyan) 6C, and a fourth image forming unit (black) 6BK. As previously, the formed toner image is transferred and synthesized to form a color image. The transfer paper 4 formed with the color image after passing through the fourth image forming unit 6BK is separated from the conveyor belt 5 and ejected, after being fixed at a fixing unit 16.

The image forming apparatus includes a correcting unit that uses a test (correction) pattern detection method, to optimize image forming conditions of the color image and obtain a high quality output. In the present embodiment, the image forming units of each color 6Y, 6M, 6C, and 6BK are actually operated and form correction patterns on the conveyor belt 5 as the toner image. The correction patterns respectively detect positional deviations between each color component image, and a density fluctuation of the color component image. Then, changes in the correction patterns caused by different device conditions and characteristics of the image forming units of each color 6Y, 6M, 6C, and 6BK are detected, thereby determining operating conditions. To detect the correction patterns, detection sensors 17, 18, and 19 are arranged on the conveyor belt 5. The positional-deviation and the density fluctuation are detected by the following method.

Positional-Deviation Detection

The image forming units of each color 6Y, 6M, 6C, and 6BK are arranged in a line in a conveying direction of the conveyor belt 5 in a predetermined relationship. However, due to various reasons, sometimes, positional deviation occurs between the color component images. When positional deviation occurs, the toner images of the color components do not superimpose at a position where they should theoretically. Such a positional deviation can occur, due displacement of the axes of the photosensitive drums 9Y, 9M, 9C, and 9BK, non-parallelism of the axes of the photosensitive drums, displacement of a deflecting mirror (not shown) that deflects laser light in the exposing unit 11, an error in writing timing to the photosensitive drums, and the like.

Therefore, when deviations occur, the writing timing of each color component image to the photosensitive drums 9Y, 9M, 9C, and 9BK is adjusted so that the each color component image is superimposed exactly on a transferring position on the conveyor belt 5. The device conditions causing the deviations may change over time due to changes in temperature and the like. Even if the deviation is adjusted once, it may occur again. Thus, the operating conditions are detected by a correction-pattern detection method, at a timing that the device conditions are prone to change, and the operating conditions are corrected according to the obtained result. The timing that the device conditions are prone to change, for example, may be when activating from a dormant state to an active state such as turning the power on, outputting prints exceeding a predetermined number since the previous adjustment, a change in a predetermined temperature, and the like.

The positional deviation that occurs between the color component images is corrected by adjusting the resist in a sub-scanning, the inclination (skew), the resist in a main scanning, and the magnification error in the main scanning, respectively. Therefore, deviation amounts of these components are calculated, and the positional-deviation correction patterns for obtaining the respective correction amounts are formed, thereby detecting the patterns by the detection sensors.

Figure 2:
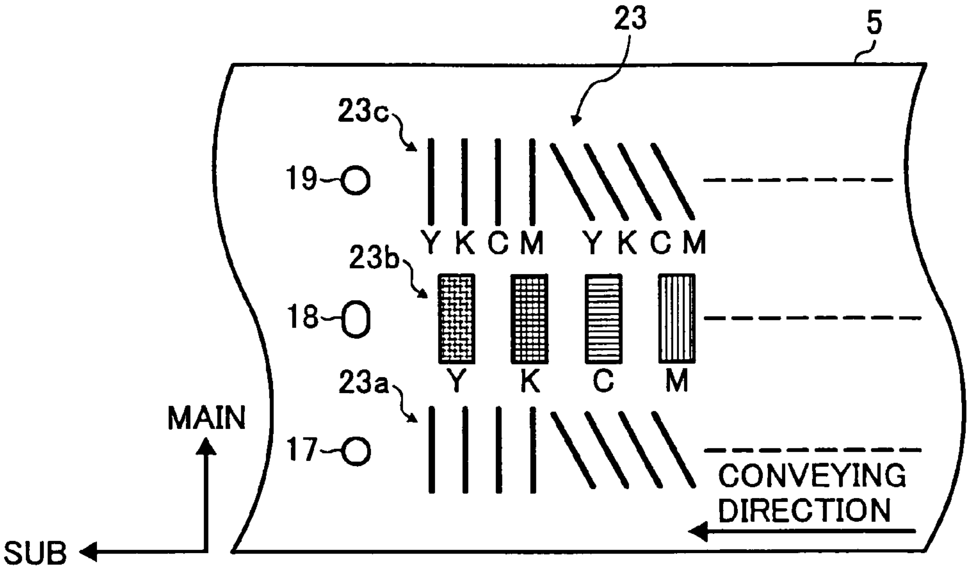
FIG. 2 is a top view of a conveyor belt shown in FIG. 1.

FIG. 2 is a top view of the conveyor belt 5 formed with correction patterns 23. The correction patterns 23, as shown in FIG. 2, are formed in three regions divided in the main scanning direction. In the two regions at both sides, a plurality of units of positional-deviation correction patterns 23*a* and 23*c* are arranged in the sub-scanning direction. The positional-deviation correction patterns 23*a* and 23*c* include a unit (set) of patterns made of four horizontal lines (lines parallel to the main scanning direction) and four oblique lines (inclined lines) of each color. In the center region, density correction patterns 23*b* are formed.

Figure 3:
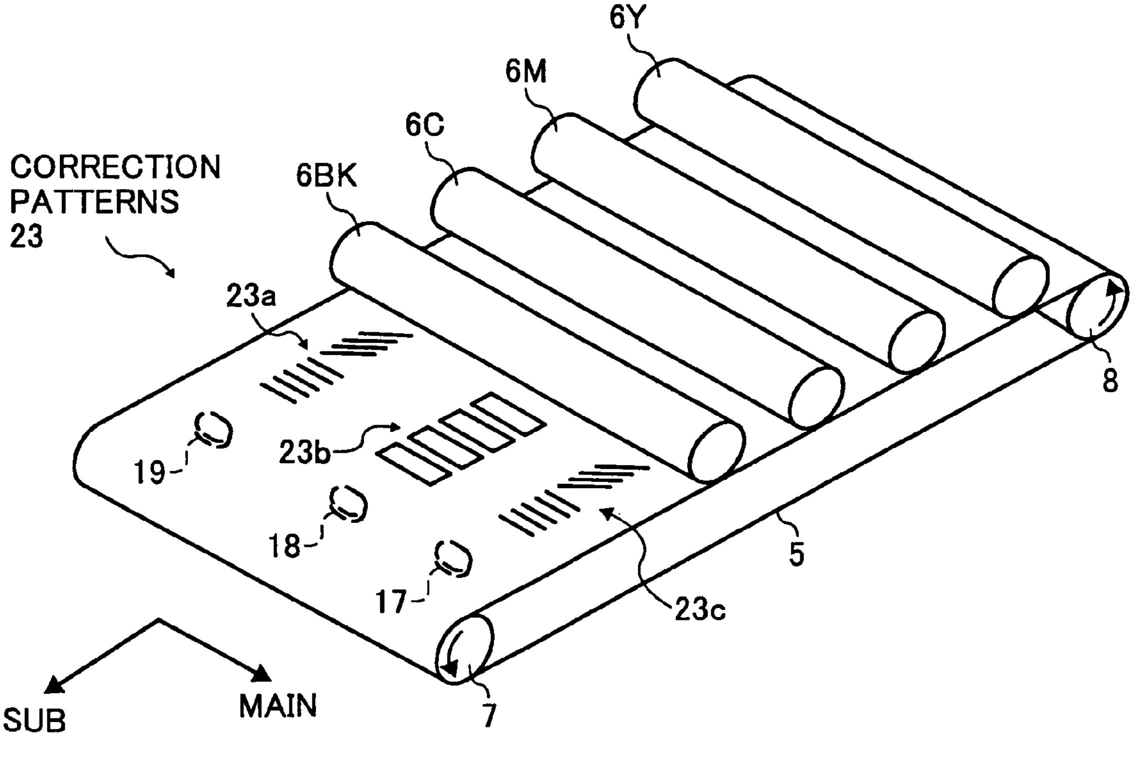
FIG. 3 is a perspective view of a related configuration of detection sensors shown in FIG. 1 and correction patterns shown in FIG. 2.

The detection sensors 17 to 19 are arranged at three locations, along the lines of the correction patterns formed in three divided regions in the main scanning direction. FIG. 3 is a perspective view for explaining the positions of the detection sensors 17 to 19 and the correction patterns 23. As shown in FIG. 3, the detection sensors 17, 18, and 19 are arranged so as to oppose the positional-deviation correction patterns 23*a* and 23*c* formed in two locations at the both sides of the conveyor belt 5, and the density correction patterns 23*b* formed in the center.

Figure 4:
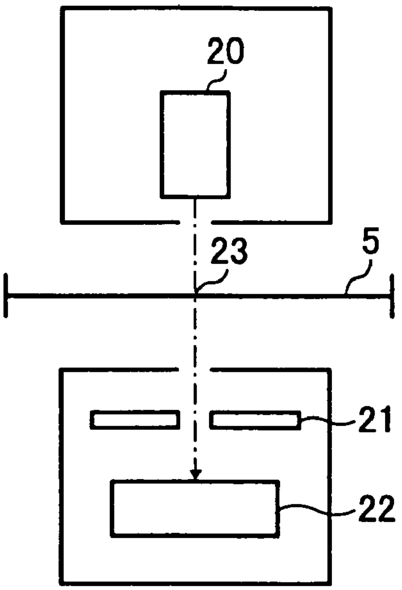
FIG. 4 is a diagram showing a more detailed configuration of the detection sensor.
Figure 5A:
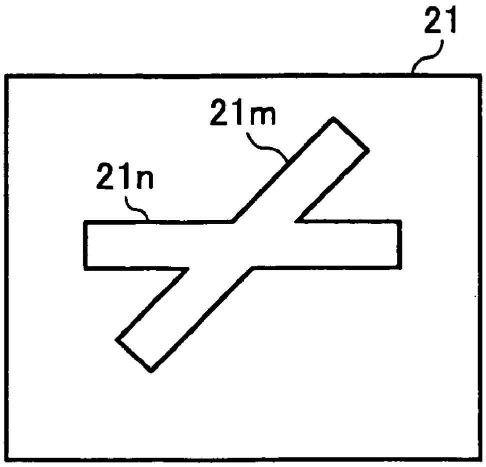
FIGS. 5A and 5B are schematic diagrams for explaining exemplary shapes of slits shown in FIG. 4.

FIG. 4 is a detailed configuration diagram of the detection sensors 17 to 19. As shown in FIG. 4, the detection sensors 17 to 19 include a light emitting unit 20, a slit 21, and a light receiving unit 22, and detect the correction patterns 23 formed on the conveyor belt 5. The slit 21 of the detection sensors 17 and 19 detects the positional-deviation correction patterns 23*a* and 23*c*. As shown in FIG. 5A, the slit 21 has openings 21*n* and 21*m* in parallel with lines parallel to the main scanning direction, and lines inclined with respect to the lines parallel to the main scanning direction, to detect these lines respectively. The slit 21 detects the patterns 23 formed on the conveyor belt 5 through the openings 21*n* and 21*m*, when the patterns 23 pass through a sensor position. The sensor 18 of the density correction patterns 23*b* basically has the same configuration. However, because there is no need to detect oblique lines, a slit that has an opening 21*n* only corresponds to the lines parallel to the main scanning direction, shown in FIG. 5B, may preferably be used.

As shown in FIG. 2, the positional-deviation correction patterns 23*a* and 23*c* are respectively made of the parallel lines and the oblique lines of K, M, Y, and C. The positional-deviation correction patterns 23*a* and 23*c* form each line with a predetermined shape and a target pitch d, in view of the relationships between the openings 21*n* and 21*m* of the detection sensors (see FIG. 6). By doing so, when the line passes over the slit of the respective pattern sensors 17, 18, and 19 that are arranged to oppose the correction patterns 23 for color deviation, detection signals are produced in a typical wave form indicating the line position. As a result, detection accuracy can be improved.

Several different methods have been developed to determine the line position. One method is to detect a change in transmitted light amounts of the slit when the edge of the line passes through the detection sensor. By processing the detected value with a predetermined threshold value, the edge of the line is detected, thereby obtaining a position count value upon edge detection, as position detection signals (hereinafter, "edge detection method"). In this method, the line position is determined by a method using the obtained edge position detection signals directly to detect the deviation amounts between each color component. Alternatively, the line position can be determined by a method determining the position signals of the line center from the edge position detection signals at both sides of the line.

Another method is to obtain the peak (mountain) or the bottom (valley) of the detection signals of the detection sensor as the detection signals, by equalizing width of the line and the slit (hereinafter "peak detection method"). The detection signals of the detection sensor change when the line passes through the detection sensor. In this method, when the line and the detection sensor are overlapped, the signals show either the peak or the bottom of the extreme value. This is used to detect the line center, and the position count value upon detecting the line center is obtained as the position detection signals.

The positional-deviation correction patterns 23*a* and 23*c* are formed by arranging a plurality of units of patterns in line in the sub-scanning direction. This is because writing and detecting errors of the patterns may be suppressed, by calculating an average of the units of detection results. The writing and the detecting errors of the patterns may occur because of a change of speed of the conveyor belt 5 moving in the sub-scanning direction and the like. As a result, the detection accuracy can be improved.

The horizontal lines and the oblique lines of Y, BK, C, and M of the positional-deviation correction patterns 23*a* and 23*c* are respectively detected by the detection sensors 17 and 19. The line position is detected based on the detection signals. Line intervals between each color component with respect to a standard color (generally, BK) can be obtained, based on the obtained line position signals. As a result, the skew, the resist in the sub-scanning direction, the resist in the main scanning direction, and the magnification error in the main scanning direction with respect to the standard color (generally, BK) can be obtained.

The deviations and errors can be corrected, by controlling an operation of a scanning exposure device and writing of an image so as to eliminate the deviations and the errors being obtained, and shifting the image. The skew can be corrected, for example, by adjusting the inclination of the deflecting mirror in the exposing unit 11 or by adjusting the exposing unit 11 with an actuator. The positional deviation of the resist in the sub-scanning direction can be corrected, for example, by controlling a write start timing of the line and a surface phase of a polygon mirror. The magnification error in the main scanning direction can be corrected, for example, by changing image writing frequency. The positional deviation of the resist in the main scanning direction can be corrected, by correcting the write start timing of the main scanning direction.

Calculation of correction amounts and a correction processing method may basically be carried out by applying the related art (see the Japanese Patent Application Laid-Open No. H11-249380 and the Japanese Patent Application Laid-Open No. 2004-101567). Therefore, the detailed description is omitted here.

Density Detection

The tandem type apparatus includes the image forming units 6Y, 6M, 6C, and 6BK for each color. Sometimes the characteristics of a density controlling unit, such as a developing bias, vary from color to color. This may generate deviations in an actual density of the formed image, with respect to a control target value being set.

Such deviations can be corrected and a predetermined density and a predetermined hue are can be obtained by adjusting the developing bias and the like of the image forming units 6Y, 6M, 6C, and 6BK. The device conditions that can cause the deviations are fluctuation and the like of the developing bias, a charging bias, laser exposing power and the like. The operating conditions are detected using the correction-pattern detection method, at a timing that the device conditions are prone to change, and the operating conditions are corrected according to the obtained result.

The density correction patterns are the patterns in which the density varies step-by-step. Specifically, a predetermined developing bias that varies step-by-step is applied to form the density correction patterns. Those density correction patterns are then detected by using detection sensors.

The density correction patterns, i.e., the correction patterns 23 shown in FIG. 2, have patches in the center of the main scanning line on the conveyor belt 5. The patches have a predetermined width in the sub-scanning direction, and formed as respective patches of four color components Y, BK, C, and M. These patches, although not shown in FIG. 2, are a unit (set) of four color components. A plurality of units of patches of different densities is formed as the patterns arranged in a line in the sub-scanning direction. In other words, the density correction patterns 23*b* with a plurality of grayscale levels are formed. The detailed description of the correction patterns, which is the feature of the present embodiment, formed by combining the positional-deviation correction patterns and the density correction patterns is hereinafter described with reference to FIG. 6.

The reason why the patches of the density correction patterns 23 are formed in the center of the main scanning line is because it is difficult to obtain an average density at the front and the rear of the main scanning line, that is, at the both sides of the conveyor belt 5. To adjust the density properly, it is preferable to perform the correction at the center where an intermediate density can be obtained. Therefore, as shown in a perspective view of FIG. 3, the patterns are arranged in a line in the sub-scanning direction in the center region of the main scanning line, so as to show a relationship between the density correction patterns 23*b* and the detection sensor 18. Accordingly, the detection sensor 18 that is arranged corresponding to the patterns detects the patterns.

Figure 5B:
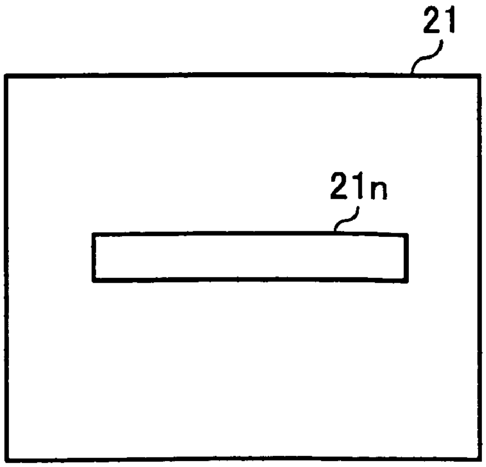

The configuration of the detection sensor that detects the density correction patterns 23*b* may be basically the same as that shown in FIG. 4, i.e., the detection sensor for the positional-deviation correction patterns. However, the density correction patterns 23*b* only need to set a relationship between the patch and the opening so that light from each patch of the patterns 23*b* can be sampled a plurality of times per patch, through the slit that has an opening of a predetermined size. Accordingly, as shown in FIG. 5B, a simple design of providing the opening 21*n* to the slit 21 for a rectangular patch is enough.

The density adjustment may be controlled by controlling the developing bias, according to the detection result of the detection sensor 18. However, it is also possible to adopt methods of controlling the charging bias, laser exposing power and the like.

Next, a configuration of the correction patterns will be described in detail. In the related art, the respective forming and the detecting processes of the positional-deviation correction patterns and the density correction patterns (patches) are performed separately. While correction operation is performed, the conveyor belt, the intermediate transfer belt, or the like, only forms the correction patterns, and is exclusively used for that purpose. As for the positional-deviation, only the positional-deviation correction is performed. Therefore, a longer processing time is required because the respective processing time needs to be added.

In the present embodiment, to reduce the processing time, the formation and the detection of the positional-deviation correction patterns and the density correction patterns (patches) are performed simultaneously.

More specifically, as outlined above, the respective positional-deviation correction patterns and the density correction patterns (patches) are formed on the conveyor belt 5, in the respective regions divided in the main scanning direction. By detecting the patterns formed in each region by the respective corresponding sensors, the forming and the detecting processes can be performed simultaneously. In the embodiment, the main scanning direction is divided into three regions and the positional-deviation correction patterns and the density correction patterns (patches) are combined and formed respectively. The positional-deviation correction patterns are formed in two regions at the sides of the conveyor belt 5. The density correction patterns (patches) are formed in the center region.

Figure 6:
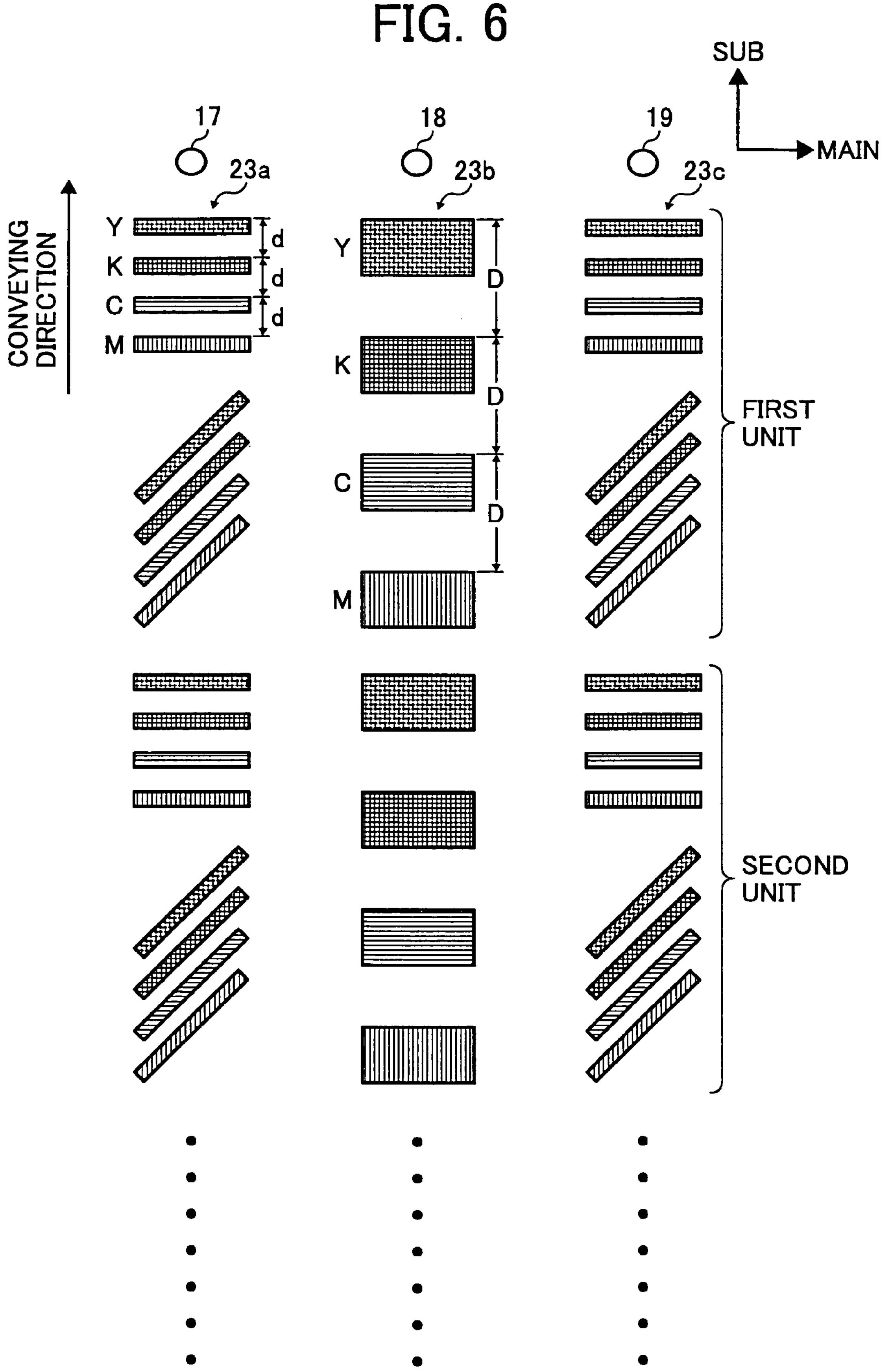
FIG. 6 is an example of a combined pattern.

FIG. 6 is an example of a combined correction pattern formed by combining the positional-deviation correction patterns and the density correction patterns.

In a pattern configuration shown in FIG. 6, the main scanning direction is divided into three regions. The positional-deviation correction patterns 23*a* and 23*c* are formed in two regions at the sides of the conveyor belt 5. The positional-deviation correction patterns 23*a* and 23*c* include a unit (set) of patterns made of four horizontal lines (lines parallel to the main scanning direction) and four oblique lines (inclined lines) of four color components Y, BK, C, and M. The density correction patterns (patches) 23*b* are formed in the center region of the conveyor belt 5. The density correction patterns (patches) 23*b* include a unit (set) of patterns made of four color components Y, BK, C, and M that are set to a predetermined density.

The density correction patterns 23*b* change the density according to the grayscale of each unit. Accordingly, in the embodiment, a unit of patterns made of rectangular patches of four color components Y, BK, C, and M are formed, by setting the developing bias at the same density. When the patterns for the next unit are formed, the density is changed by changing the developing bias. Because the density correction patterns 23*b* are formed under such operating conditions, thereby influencing the positional-deviation correction patterns 23*a* and 23*c* that are made of a unit of four horizontal lines and four oblique lines of four color components, formed simultaneously. Accordingly, when the positional-deviation correction patterns are formed regardless of the operation of the density correction patterns 23*b*, the density is changed in the middle of a unit of patterns, thereby causing a detection error of the positional deviation. Therefore, a writing region in the sub-scanning direction of the positional-deviation correction patterns 23*a* and 23*c*, and the density correction patterns 23*b* of each unit are combined, so as to respectively form a unit of patterns in the region shown as a first unit, a second unit, and the like in FIG. 6.

By combining the writing regions in the scanning direction of the positional-deviation correction patterns 23*a* and 23*c*, and the density correction patterns 23*b* of each unit, the change in the density of the positional-deviation correction patterns in a unit can be prevented. When the detection sensors 17 and 19, which detect these patterns, perform the threshold value processing of the detection light amount, fluctuations that occur between the patterns with different densities can be suppressed (refer to the explanation of the edge detection method). As a result, the accuracy can be maintained.

However, when the combined patterns are used, a pattern density varies with each unit. Therefore, when the threshold value processing is performed to the detection light amount detected by the detection sensors 17 and 19, fluctuations may occur between the units when the same threshold value is used for each unit.

To improve the fluctuations between the units, a variable threshold value is used for the detection light amounts of the detection sensors 17 and 19. In other words, the threshold value is changed according to a density level of the relevant region. A method of experimentally obtaining an optimum threshold value with respect to the density level in advance may be adopted. Then, the obtained optimum threshold value may be used corresponding to the density level set upon the pattern formation. As a result, the fluctuations that occur between the units can be suppressed, and the accuracy can further be improved.

Another embodiment of the combined patterns is described below. This embodiment is a development of the combined patterns enabling to use the patterns related to the density correction patterns also to the positional-deviation correction patterns. In other words, this embodiment relates to adopting the patterns that can be commonly used as both the positional-deviation correction patterns and the density correction patterns.

In the density correction patterns 23*b* forming a unit of patterns with patches of four colors, as shown in FIG. 6, the rectangular patches were used as an example. The reason why the patches are rectangular in shape, is because the relationship between the slit and the opening is set, so that the sampling through the slit of the detection sensor 18 may be performed a plurality of times per patch.

When the patterns are formed by the rectangular patches of four colors, the patches have an edge in the sub-scanning direction. Accordingly, by using this edge, the four color rectangular patches may function as the positional-deviation correction patterns, similar to the patterns of horizontal lines (lines parallel to the main scanning direction) of four colors in the positional-deviation correction patterns 23*a* and 23*c*.

To make the rectangular patches function as the positional-deviation correction patterns, the edge position needs to be defined as that of the positional-deviation correction patterns 23*a* and 23*c*. Therefore, when the density correction patterns 23*b* are formed, the edge position of the patch is defined as formation conditions of the patterns, for example, as shown in FIG. 6, so as the pitch between the patches is a target value D.

As to detection characteristics of the detection sensor 18, the edge detection is also made possible. Also, a matching to the edge detection characteristics of the detection sensors 17 and 19 that detect the positional-deviation correction patterns also becomes a condition. To match the characteristics, the opening 21*n* of the slit 21 of the detection sensor 18 should have the same configuration as the detection sensors 17 and 19.

By adopting the patterns that can be commonly used as both the positional-deviation correction patterns and the density correction patterns, the accuracy of the positional-deviation correction can further be improved.

A correction function forms the positional-deviation correction patterns and the density correction patterns (patches) on the conveyor belt 5, detects the formed patterns (patches) by the detection sensors 17, 18, and 19, and optimizes the image forming conditions according to the detection result. The correction function is incorporated into a control system of the image forming apparatus.

Figure 7:
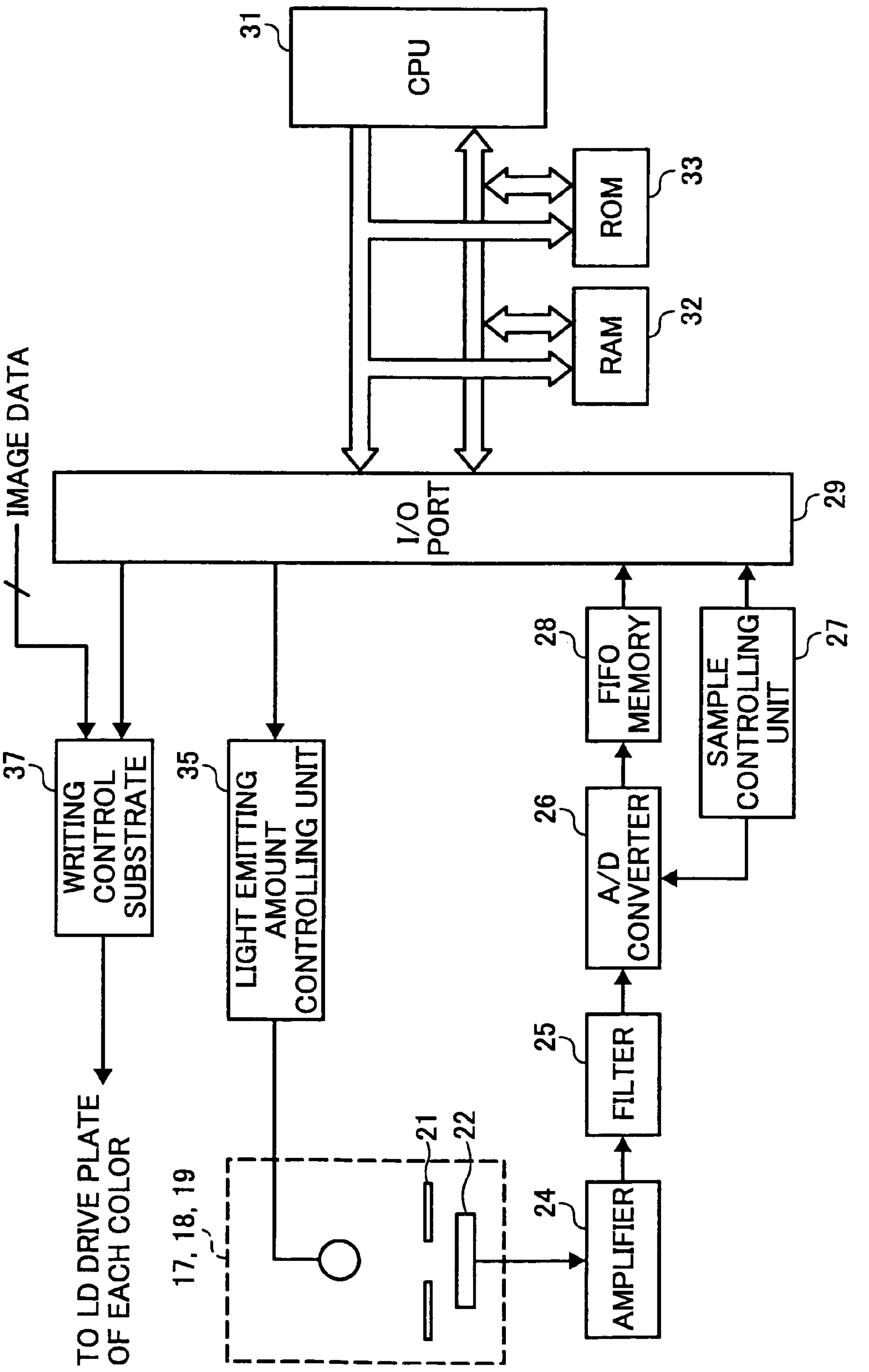
FIG. 7 is a schematic diagram of a control system (hardware) for realizing positional-deviation correction and density correction.

FIG. 7 is a schematic diagram of a control system (hardware) that can realize the positional-deviation correction and the density correction of the present embodiment.

In the configuration of FIG. 7, a central processing unit (CPU) 31, a random access memory (RAM) 32, and a read only memory (ROM) 33 function as the system control that controls the image forming apparatus. To realize the function, the CPU 31 uses various control programs and control data stored in the RAM 32 and the ROM 33 according to the needs. Accordingly, the CPU 31 executes a control operation to control each component including various input and output (I/O) devices. Among these, a processing flow hereinafter described (FIG. 8) required for a series of the correction operations to correct the positional deviation and the density is included.

As a hardware configuration of the system, the CPU 31 includes image data to be processed, a data path for exchanging data such as control data, and an address path between the RAM 32 and the ROM 33, and also between the various I/O devices via an I/O port 29.

Some of the various I/O devices include a writing control substrate 37, a light emitting amount controlling unit 35, a first-in-first-out (FIFO) memory 28, and a sample controlling unit 27. Also, an actuator, various motors (both not shown), and the like, related to a control of a laser beam writing (scanning exposure) are included.

The writing control substrate 37 includes a circuit for operating a normal printing mode, and another circuit for forming the correction patterns 23 to operate a positional-deviation correction mode and a density correction mode.

The light emitting amount controlling unit 35 adopts a type of pattern sensors that has a light emitting unit for pattern detection, to the pattern sensors 17, 18, and 19 for detecting the correction patterns 23. The light emitting amount controlling unit 35 is a device that controls the light emitting amount of the light emitting unit. The FIFO memory 28 and the sample controlling unit 27 are devices for obtaining the detection data from the pattern sensors 17, 18, and 19.

When the correction patterns 23 are actually formed according to an execution command of the CPU 31, and the correction amounts is determined by performing the pattern detection, the correction patterns 23 are formed on the conveyor belt 5 by operating the image forming units of each color 6Y, 6M, 6C, and 6BK. Then, line (patch density) detection signals of the patterns 23 detected by the light receiving unit 22 of the pattern sensors 17, 18, and 19 are amplified by an amplifier (AMP) 24. As a result, frequency components that exceed the frequency required by a filter 25 will be cut.

Next, the line (patch density) detection signals are converted to digital data from analog data by an analog-digital (A/D) converter 26. Sampling of the data is controlled by the sample controlling unit 27. Sampled data is sequentially stored in the FIFO memory 28.

When the detection of a unit of lines (patches) is finished, the stored data is loaded in the CPU 31 and the RAM 32 by the data path via the I/O port 29. According to the programs stored in the ROM 33, arithmetic processing is performed to calculate various positional-deviation amounts and density deviation amounts, and the correction amounts for correcting the deviation that optimize the image forming conditions.

The calculated correction amounts are used for correcting the set value of the image forming conditions, such as the operating conditions, the writing timing, and the developing bias of the scanning exposure device for the respective image forming units 6Y, 6M, 6C, and 6BK. The correction amounts are stored and managed in a memory unit, as required data, until the next correction processing is performed.

Next, an embodiment of a processing process according to the positional-deviation correction and the density correction that are executed by the CPU 31 of the control system (FIG. 7) will be described.

The correction processing of the present embodiment performs the processing under the following conditions 1 to 3:

1. A selection of correction operation modes is possible, under a set condition of whether to perform the positional-deviation correction and the density correction simultaneously, or only to perform the respective corrections.

In this selection of the correction operation mode, a method automatically set by the device or a method set by a user from a not shown operation panel may be adopted.

In the method automatically set by the device, when a system controlling unit performs an image forming operation according to a print request, it is checked whether the device satisfies execution conditions of a predetermined operation mode. The operation mode is selected by the result of the check. When the execution conditions are not satisfied, the correction operation will not be performed.

As the execution conditions, for example, the following conditions may apply to the respective positional-deviation correction and the density correction.

Positional-Deviation Correction:

When a predetermined number of prints are printed after executing a previous positional-deviation correction When a predetermined temperature change is detected since executing the previous positional-deviation correction When a door of the device is opened (changes in device conditions are expected).

Density Correction:

When a predetermined number of prints are printed after executing a previous density correction When a predetermined temperature change is detected since executing the previous density correction When a door of the device is opened (changes in device conditions are expected).

In the method when the correction operation mode is set manually through the operation panel, the correction operation of an instructed mode is performed. This is performed either by performing the positional-deviation correction and the density correction simultaneously, or by only performing the respective correction. The operation may be instructed through a selection key or the like provided on a setting screen.

Also, the automatic and the manual settings may be combined, thereby enabling to interpolate the automatic operation with the manual operation.

2. When the positional-deviation correction and the density correction are performed simultaneously, the threshold value should be changed according to the density level of the corresponding regions. The threshold value is used to detect the edge of the positional-deviation correction patterns formed respectively in the regions in the sub-scanning direction. As described previously, the density (grayscale) is changed for each unit of the patterns (patches) in the sub-scanning direction. Therefore, in the edge detection of the patterns for obtaining the positional-deviation amounts, fluctuations may occur between the units as a side effect. To improve this point, the edge is detected by using variable threshold value according to the density level of the corresponding regions for the detection light amounts of the detection sensors 17 and 19. A method of experimentally obtaining the optimum threshold value with respect to the density level in advance may be adopted. Then, the obtained optimum threshold value may be used corresponding to the density level set upon the pattern formation.

3. Whether an execution of the correction operation is required for the obtained correction amounts is judged, based on the detection result of the correction patterns. Then whether to execute the respective operations of the positional-deviation correction and the density correction is decided, according to the judged result.

In the respective positional-deviation correction and the density correction, the correction amounts are obtained based on the detection result of the correction patterns. When the obtained correction amounts exceed a predetermined appropriate range, a judgment is made considering the processing to be a failure. Following the judgment, the execution of the correction operation in which the processing only considered to be a failure can be stopped. Whereas, a valid processing can be executed, thereby preventing deterioration of image quality without wasting the valid processing.

Figure 8A:
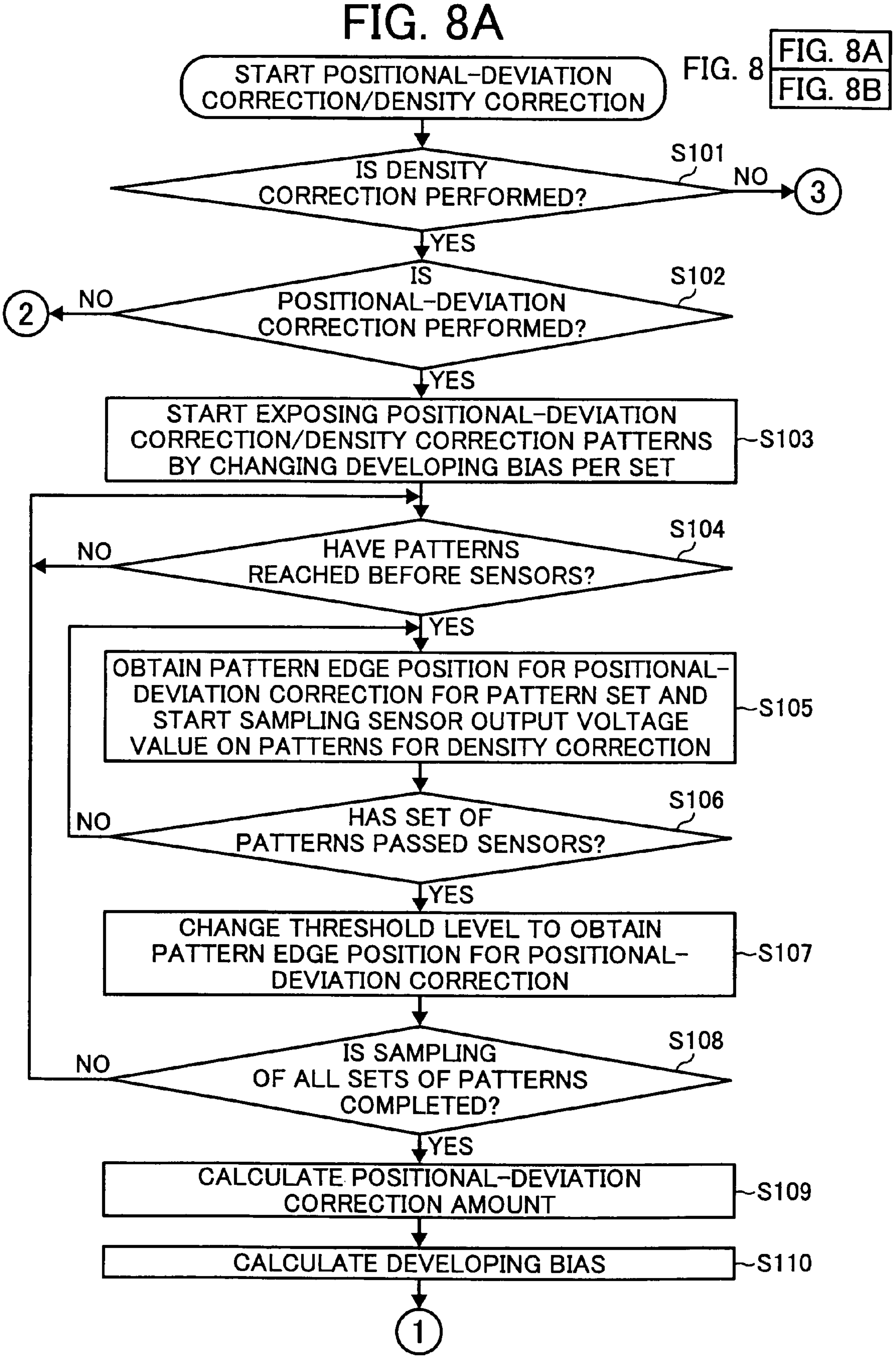
FIG. 8 is a flowchart of a simultaneous processing.
Figure 8B:
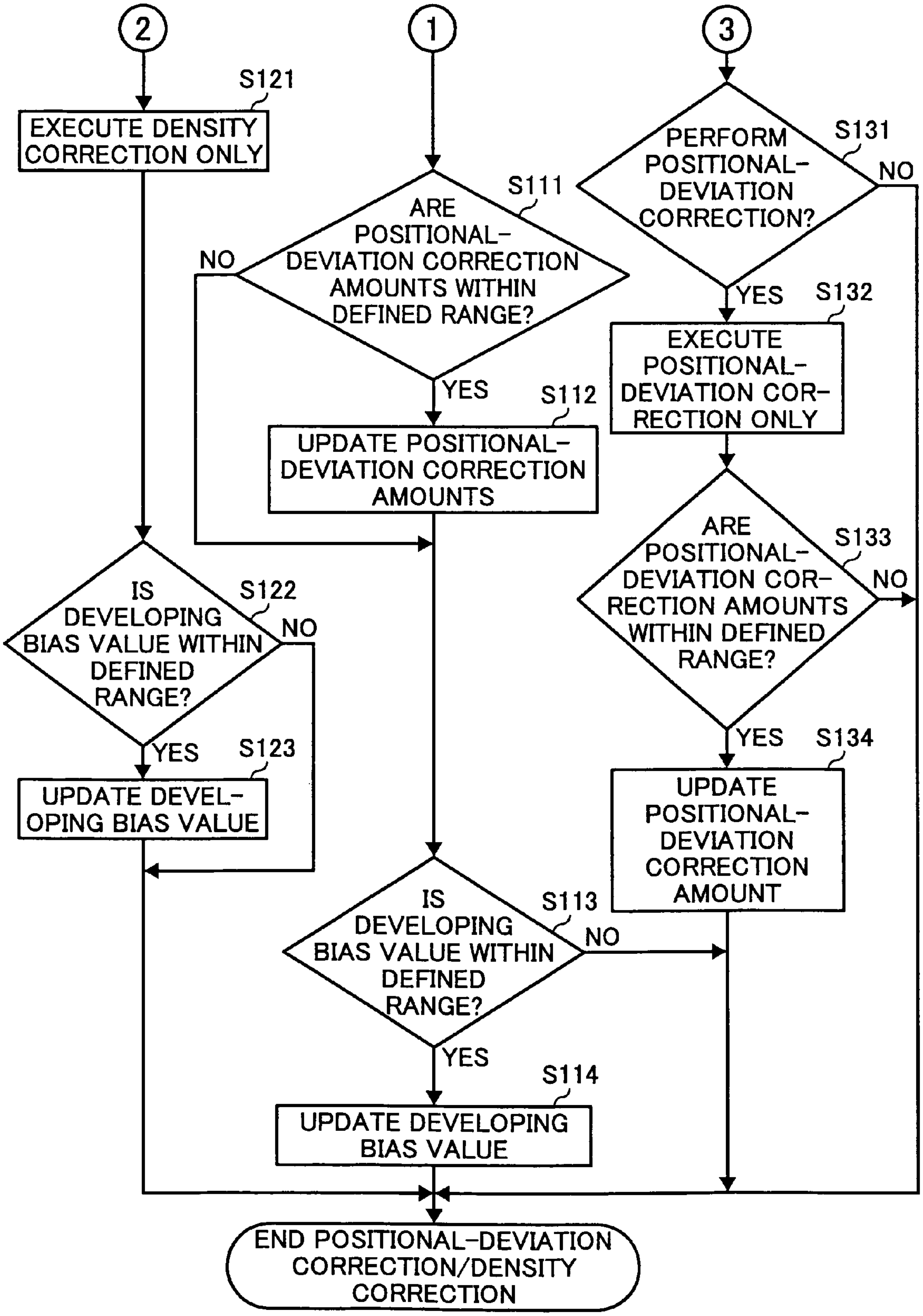

The processing process according to the positional-deviation correction and the density correction of the present embodiment performed under the conditions 1 to 3 will now be described with reference to a processing flowchart of FIG. 8.

The CPU 31 of the system controlling unit activates a program to execute the processing flow according to the correction (control), when the image forming operation is performed under the print request or at an appropriate timing when the device conditions are expected to change upon turning the power on and the like.

In the beginning of the processing flow, it is checked whether the density correction is performed (step S101). This is checked either by checking the conditions set in advance as the operating conditions of the density correction (condition 1), or when it is set by a user, by checking a mode setting of the density correction, from an input state of the setting screen of the operation panel.

According to the result of the check, when the execution conditions of the density correction are satisfied, or when the execution of the density correction is instructed by the user (YES at step S101), the density correction is performed. At the same time, it is checked whether the positional-deviation correction is performed at this point (step S102). This is because, in this processing flow, the formation of the correction patterns, the detection of the patterns, and the like, of the respective positional-deviation correction and the density correction are performed simultaneously, when the positional-deviation correction is also performed with the density correction. This is checked either by checking the conditions set in advance as the operating conditions of the positional deviation (condition 1), or when it is set by a user, by checking a mode setting of the positional-deviation correction, from an input state of the setting screen of the operation panel.

According to the result of the check, when the density correction is executed with the positional-deviation correction (YES at step S102), a processing is started to process these corrections simultaneously. In the beginning of the processing, the correction patterns are scanned and exposed. The correction patterns 23 formed on the conveyor belt 5 are lined in three patterns by combining the correction patterns of the respective positional-deviation correction and the density correction. As described above, a pattern forming processing is carried out by changing the developing bias by each unit (set) according to a predetermined grayscale level (step S103).

Each of the correction patterns formed at step S103 is moved with the conveyor belt 5, and detected by the detection sensors 17, 18, and 19 provided to oppose the correction patterns 23 in three lines on a conveying path. Therefore, it is checked whether the correction patterns 23 have reached before the detection sensors 17, 18, and 19 (step S104). The checking method may be, for example, to check whether a timer, which was started at the start of the exposure of the correction patterns 23, has reached a time count (obtained from a layout size, operating conditions, and the like of the device). The time count is a length that the patterns took to reach before the detection sensors 17, 18, and 19.

When it is confirmed that the correction patterns have reached before the detection sensors by the timer (YES at step S104), the detection sensors 17, 18, and 19 will start detecting and processing a unit (set) of the correction patters 23 (step S105). The positional correction patterns are detected, when the edge detection method is used, by sampling signals within a range that the edge signals can be detected. When the peak detection method is used, signals are sampled within a range that the extreme value can be detected. Also, for the density correction patterns (patches), signals are sampled within a range that a plurality of density signals can be detected.

The detection signals of the correction patterns 23 are processed as detection signals. The detection signals are a basis for obtaining data of the respective positional-deviation correction and the density correction. As for the positional-deviation correction, position signals of the edge or the center of the line are detected as the position signals of the patterns. In the simultaneous processing of the positional-deviation correction and the density correction, the positional-deviation correction patterns are formed under the setting that the density level of the density patterns are grouped in the same region in the sub-scanning direction. Therefore, the threshold value (threshold level) processing, which is performed when the line edge signals are detected, is performed by using the variable threshold value according to the density level of the relevant region. As for the density correction, a processing of determining an average value of a plurality of sampled density signals is performed.

In the simultaneous processing of the positional-deviation correction and the density correction, the pattern forming processing is performed by changing the developing bias by a unit (set) according to a predetermined grayscale level. Thus, the processing needs to be managed by a unit. Particularly, in this processing flow, the threshold value (threshold level) processing, which is performed when the line edge signals are detected, uses the variable threshold value according to the density level of the unit. Accordingly, the processing is managed corresponding to this processing.

Therefore, in the processing flow, it is checked whether a unit of the correction patterns 23 have passed the detection sensors 17, 18, and 19 (step S106). When it is confirmed that the unit of correction patterns 23 have passed the detection sensors 17, 18, and 19, the threshold level of the threshold value processing, which is performed when the line edge signals are detected, is changed according to the pattern density (step S107). The line edge signals are detected based on the detection signals of the positional-deviation correction patterns. Thereafter, the correction patterns of the unit that are to be processed next are detected by the detection sensors.

The processing of the steps S104 to S107 are repeated, until it is confirmed that the processing with respect to all the units (sets) of the correction patterns 23 are completed, while changing the threshold value by a unit and managing the processing process.

When it is confirmed that the detection processing of all the units (sets) of the correction patterns 23 has completed (YES at step S108), calculation processing of the correction amounts is performed, based on the detection signals obtained in the previous stage (step S109 and S110).

As for the positional-deviation correction amounts, deviations and errors are calculated based on the change of line intervals of the correction patterns 23*a* and 23*c* shown in FIG. 6. The operation of the scanning exposure device and the writing of the image are controlled so as to eliminate the obtained deviations and errors. The arithmetic processing is performed to calculate the control amount for shifting the image as correction data. When the correction patterns 23*b*, which can also be used as the density correction, as shown in FIG. 6, are used as the positional-deviation correction patterns, the calculation of the correction amounts including the pattern edge position signals detected by the detection sensor 18 is performed. As a result, the accuracy of the positional-deviation correction may further be improved.

In the density correction amounts, the arithmetic processing is performed to calculate an appropriate control amount of the developing bias as the correction data. The calculation is performed by a sensor output voltage value that is sampled from a density patch of the density correction patterns in the previous stage, and a developing bias value corresponding to the detection sensor output voltage value.

After calculating the correction amounts of the respective positional-deviation correction and the density correction, a processing for correcting the past correction amounts is performed using the calculated correction amounts.

However, in this processing flow, all the correction amounts obtained as the calculated result should not be used unconditionally. A range that the obtained correction amounts may be considered error free (hereinafter "appropriate range") is set. The processing is executed only by using the correction amounts within the range (condition 3).

In the processing flow, it is checked whether the calculated positional-deviation correction amounts are within a defined appropriate range (step S111). By only using the correction amounts within the range, the control amounts set thus far are updated and made proper (step S112).

Similarly for the density correction amounts, it is checked whether the developing bias is within the range (step S113). By only using the developing bias value within the range, the control amounts set thus far are updated and made proper (step S114).

On the other hand, when the calculated correction amounts exceed the appropriate range and considered to have an error, the respective positional-deviation correction and the density correction are not executed, and are controlled with the previous setting.

Therefore, a false correction operation will not be executed by the setting processing of the correction amounts, thereby operating normally.

After the correction amounts are processed by the setting processing, this processing flow is completed.

Going back to the description of the step S101 of the processing flow, it is checked whether the density correction is performed. According to the result of the check, when the density correction is not performed (NO at step S101), it is then checked whether the positional-deviation correction is performed (step S131). This is checked either by checking the conditions set in advance as the operating conditions of the positional-deviation corrections (condition 1), or when it is set by an user, by checking the operation mode being set, from an input state of the setting screen of the operation panel. According to the result of the check, when the positional-deviation correction is also not performed (NO at step S131), this processing flow is passed through without performing the correction processing.

On the other hand, when the positional-deviation correction is performed (YES at step S131), only the positional-deviation correction is executed (step S132), since the density correction is not performed here. Because the density correction patterns 23*b* in the correction patterns 23 shown in FIG. 6 are not required at this time, it is preferable not to form the patterns. Because there is no need to change the density of the positional-deviation correction patterns 23*a* and 23*c*, all the units are formed in a predetermined density. When the density of the patterns is fixed, the threshold value of the edge detection at the next stage does not change either.

However, when the correction patterns 23*b*, which can commonly be used for the density correction, are used as the positional-deviation correction patterns, the correction patterns 23*b* that can commonly be used for the density correction are also formed.

In the step S132, the execution of the positional-deviation correction is performed basically the same as the processing according to the positional-deviation correction in the steps S103 to S109.

After executing the positional-deviation correction, it is checked whether the calculated positional-deviation correction amounts are within a defined appropriate range (step S133), as the processing shown at steps S111 and S112. By only using the correction amounts within the range, the control amounts set thus far are updated and made proper (step S134).

After the correction amounts are processed by the setting processing, this processing flow is completed.

Going back to the description of the step S101 of the processing flow, it is checked whether the density correction is performed. According to the result of the check, when the density correction is performed (YES at step S101), it is then checked whether the positional-deviation correction is performed (step S102).

According to the result of the check, when the positional-deviation correction is not performed (NO at step S102), only the density correction is executed (step S121). Because the positional-deviation correction patterns 23*a* and 23*c* in the correction patterns 23 shown in FIG. 6 are not required at this time, it is preferable not to form the patterns.

In the step S121, the execution of the density correction is performed basically the same as the processing according to the density correction of the steps S103 to S110.

After executing the density correction, it is checked whether the value calculated as the developing bias value to be corrected is within a defined appropriate range (step S122), as the processing shown at steps S113 and S114. By only using the developing bias value within the range, the control value set thus far are updated, and made proper (step S123).

After the control amount of the developing bias is processed by the setting processing, this processing flow is completed.

The respective embodiments are exemplary embodiments of the present invention, and various modifications are possible within the scope and spirit of the present invention.

For example, while in the respective embodiments, the configuration of forming the correction patterns 23 on the conveyor belt 5 and detecting the patterns formed on the conveyor belt 5 by the detection sensors is described. However, it may be the configuration of detecting the correction patterns formed on the intermediate transfer belt, when the image forming apparatus uses a method of forming images on the intermediate transfer belt.

While the slit is used for the detection sensor, as long as the correction patterns can be detected, it is not limited to this configuration, but the one without the slit may be used. For example, the configuration such as the line sensor may be adopted. Also, it is explained that the positional-deviation correction patterns are drawn in lines with a straight edge. However, as long as the positional deviation can be detected, it is not limited to this, but the positional-deviation correction patterns may be peak patterns in a line and the like.

According to the present invention, it is possible to reduce time required for processes of forming and detecting a plurality of correction patterns, such as the positional-deviation correction and the density correction. The correction patterns detect a state of the image forming system of each color component. Also, it can reduce control time required for adjusting the image forming conditions and the image forming system according to the detection result. As a result, the present invention can meet the users' demands for prompt processing.

The correction patterns are commonly used for both the positional-deviation correction and the density correction. A set of the positional-deviation correction patterns are formed in the same region as each set of the density correction patterns in the sub-scanning direction and in the region divided in the main scanning line. As a result, processing efficiency can be improved. When this configuration is used, a threshold value that is used for detecting the correction patterns is changed according to a density level of the corresponding region. As a result, the deviation detection can be maintained with high-accuracy.

Further, by enabling a selection of a correction requirement judgment and an operation mode, the processes for forming and detecting the correction patterns can be performed according to a need. As a result, the device can be used in the optimum operation state.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An image forming apparatus comprising:

a first image carrying member corresponding to each of a plurality of colors, the first image carrying member having a photosensitive surface configured to carry a latent image;

a scanning unit corresponding to each of the colors, the scanning unit configured to scan with light a photosensitive surface of a corresponding one of the first image carrying members in a main scanning direction and a sub-scanning direction thereby forming a color-component correction latent image used for correcting image forming conditions, wherein the scanning unit forms in the main scanning direction at least one pattern of the color-component correction latent image corresponding to each of the image forming conditions;

a developing unit corresponding to each of the colors, the developing unit configured to develop a color-component correction latent image on a photosensitive surface of a corresponding one of the first image carrying members thereby obtaining a color-component correction visual image in a corresponding color;

a second image carrying member configured to carry the color-component correction visual images;

a transferring unit that transfers each of the color-component correction visual images from the first image carrying member to the second image carrying member while the second image carrying member is conveyed in the sub-scanning direction thereby forming the pattern by aligning the color-component correction visual images in the sub-scanning direction;

a pattern detecting unit configured to detect the color-component correction pattern visual images in the pattern on the second image carrying unit; and a correcting unit that corrects the image forming conditions for each of the colors based on a detection result obtaining by the pattern detecting unit.

2. The image forming apparatus according to claim 1, wherein the pattern include a positional-deviation correction pattern to detect a positional deviation among individual color-component images and density correction pattern to detect density of the images.

3. The image forming apparatus according to claim 2, wherein the pattern is a pattern commonly used as both the positional-deviation correction pattern and the density correction pattern.

4. The image forming apparatus according to claim 2, wherein the density correction pattern includes plural sets of patterns that have different densities with different developing biases, each of the sets being used for a color component, and forms a set of the positional-deviation correction patterns in the regions partitioned in the main scanning direction and aligned in the sub-scanning direction in which the sets of the density correction patterns are aligned.

5. The image forming apparatus according to claim 4, wherein the pattern detecting unit includes a unit that changes a threshold value used for detecting the positional-deviation correction patterns formed in the regions aligned in the sub-scanning direction depending on a density level of the corresponding regions.

6. The image forming apparatus according to claim 2, wherein the correcting unit judges whether positional-deviation correction and density correction are needed based on the detection result, and performs correction only upon judging that positional-deviation correction and density correction are needed.

7. The image forming apparatus according to claim 2, further comprising an operation mode setting unit that sets an operation mode, wherein the operation mode setting unit selects and sets at least one of the positional-deviation correction and the density correction as an operation mode for correction of the image forming conditions, and the correcting unit performs correction based on the operation mode set by the operation mode setting unit.

8. An image formation control method comprising:

scanning, by an image forming apparatus, with light a plurality of a first image carrying members in a main scanning direction and a sub-scanning direction thereby forming a color-component correction latent image on each of the first image carrying members used for correcting image forming conditions, wherein the scanning includes forming in the main scanning direction at least one pattern of the color-component correction latent image corresponding to each of the image forming conditions;

developing, by the image forming apparatus, the color-component correction latent image on each of the first image carrying members thereby obtaining a color-component correction visual image on each of the first image carrying members;

transferring, by the image forming apparatus each of the color-component correction visual images from each of the first image carrying members to a second image carrying member while the second image carrying member is conveyed in the sub-scanning direction thereby forming the pattern by aligning the color-component correction visual images in the sub-scanning direction;

detecting, by a control system of the image forming apparatus, the color-component correction pattern visual images in the pattern on the second image carrying unit; and correcting by the control system of the image forming apparatus, the image forming conditions for each of the colors based on a detection result obtaining at the detecting.

9. The method according to claim 8, wherein the pattern include a positional-deviation correction pattern to detect a positional deviation among individual color-component images and density correction pattern to detect density of the images.

10. The method according to claim 9, wherein the pattern is a pattern commonly used as both the positional-deviation correction pattern and the density correction pattern.

11. The method according to claim 9, wherein the density correction pattern includes plural sets of patterns that have different densities with different developing biases, each of the sets being used for a color component, and forms a set of the positional-deviation correction patterns in the regions partitioned in the main scanning direction and aligned in the sub-scanning direction in which the sets of the density correction patterns are aligned.

12. The method according to claim 11, wherein the detecting includes changing a threshold value used for detecting the positional-deviation correction patterns formed in the regions aligned in the sub-scanning direction depending on a density level of the corresponding regions.

13. The method according to claim 9, wherein the correcting includes judges whether positional-deviation correction and density correction are needed based on the detection result, and performing correction only upon judging that positional-deviation correction and density correction are needed.

14. The method according to claim 9, further comprising setting an operation mode, wherein the setting includes selecting and setting at least one of the positional-deviation correction and the density correction as an operation mode for correction of the image forming conditions, and the correcting includes performing correction based on the operation mode set at the setting.

15. A non-transitory computer-readable recording medium, when run on a computer, configured to cause the computer to execute:

scanning with light a plurality of a first image carrying members in a main scanning direction and a sub-scanning direction thereby forming a color-component correction latent image on each of the first image carrying members used for correcting image forming conditions, wherein the scanning includes forming in the main scanning direction at least one pattern of the color-component correction latent image corresponding to each of the image forming conditions;

developing the color-component correction latent image on each of the first image carrying members thereby obtaining a color-component correction visual image on each of the first image carrying members;

transferring each of the color-component correction visual images from each of the first image carrying members to a second image carrying member while the second image carrying member is conveyed in the sub-scanning direction thereby forming the pattern by aligning the color-component correction visual images in the sub-scanning direction;

detecting the color-component correction pattern visual images in the pattern on the second image carrying unit; and correcting the image forming conditions for each of the colors based on a detection result obtaining at the detecting.

* * * * *